(12) United States Patent
Tufillaro et al.

(10) Patent No.: US 7,795,858 B2
(45) Date of Patent: Sep. 14, 2010

(54) METHODS AND APPARATUS FOR COMPUTING AND USING A SPECTRAL MAP FOR PERFORMING NONLINEAR CALIBRATION OF A SIGNAL PATH

(75) Inventors: Nicholas B. Tufillaro, Corvallis, OR (US); Robert E. Jewett, Santa Clara, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 461 days.

(21) Appl. No.: 12/004,442

(22) Filed: Dec. 18, 2007

(65) Prior Publication Data

US 2009/0153132 A1 Jun. 18, 2009

(51) Int. Cl.
*G01R 23/16* (2006.01)
(52) U.S. Cl. ............... 324/76.21; 324/76.41; 324/76.19; 324/76.12
(58) Field of Classification Search ............... 324/76.21
See application file for complete search history.

(56) References Cited

U.S. PATENT DOCUMENTS

| 6,292,760 | B1 * | 9/2001 | Burns | 702/189 |
| 6,298,096 | B1 * | 10/2001 | Burgin | 375/296 |
| 7,397,865 | B2 * | 7/2008 | Moore et al. | 375/308 |
| 7,720,644 | B2 * | 5/2010 | Barford | 702/189 |

OTHER PUBLICATIONS

"Agilent PSA Performance Spectrum Analyzer Series—Optimizing Dynamic Range for Distortion Measurements", Agilent Technologies, Inc., pp. 1-40, (Nov. 28, 2000).
Balestrieri, E., et al., "Some Critical Notes on DAC Frequency Domain Specifications", XVIII Imeko World Congress (Sep. 17, 2006).
Boyd, Stephen P., "Volterra Series, Engineering Fundamentals", Dissertation, U.C. Berkeley, pp. 1-108 (1985).
De Carvalho, Nuno Borges, et al., "Simulation of Multi-Tone IMD Distortion and Spectral Regrowth Using Spectral Balance", IEEE MTT-S Digest, pp. 729-732 (1998).
Clement, Tracy S., et al., "Calibration of Sampling Oscilloscopes With High-Speed Photodiodes", IEEE Transactions on Microwave Theory and Techniques, vol. 54, No. 8, pp. 3173-3186 (Aug. 2006).
Gans, William L., "Dynamic Calibration of Waveform Recorders and Oscilloscopes Using Pulse Standards", IEEE Transactions on Instrumentation and Measurement, vol. 39, No. 6, pp. 952-957 (Dec. 1990).

(Continued)

*Primary Examiner*—Thomas Valone

(57) ABSTRACT

In one embodiment, a spectral map for performing nonlinear calibration of a signal path is developed by 1) identifying a set of frequency locations for a set of particular output signal spurs that result from applying one-tone and two-tone input signals covering a bandwidth of interest to the signal path; 2) developing, based on the set of frequency locations, a spectral map for predistorting, in the frequency domain, signals that are applied to, or received from, the signal path in the time domain; and 3) saving the spectral map for performing nonlinear calibration of the signal path.

20 Claims, 16 Drawing Sheets

OTHER PUBLICATIONS

Ghannouchi, Fadhel M., et al., "AM-AM and AM-PM Distortion Characterization of Satellite Transponders/Base Station Transmitters Using Spectrum Measurements", IEEE Conference Proceedings of Recent Advances in Space Technologies, pp. 141-144 (2003).

Griffin, Mike, et al. in "Conditioning and Correction of Arbitrary Waveforms—Part 1: Distortion", High Frequency Electronics, pp. 18-28 (Aug. 2005).

Griffin, Mike, et al. in "Conditioning and Correction of Arbitrary Waveforms—Part 2: Other Impairments", High Frequency Electronics, pp. 18-26 (Sep. 2005).

Groulx, Ryan, et al., "Minimization of DDS Spurious Content in Multi-Channel Systems", High Frequency Electronics, pp. 18-28 (Oct. 2006).

Gupta, Rahul, et al., "Adaptive Digital Baseband Predistortion for RF Power Amplifier Linearization", High Frequency Electronics, pp. 16-25 (Sep. 2006).

Radke, Russ, et al., "A Spurious-Free Delta-Sigma DAC Using Rotated Data Weighted Averaging", IEEE Custom Integrated Circuits Conference, pp. 125-128 (1999).

Raz, Gil M., et al., "Baseband Volterra Filters for Implementing Carrier Based Nonlinearities", IEEE Transactions on Signal Processing, vol. 46, No. 1, pp. 103-114 (Jan. 1998).

Steer, Michael B., et al., "An Algebraic Formula for the Output of a System with Large-Signal, Multifrequency Excitation", Proceedings of the IEEE, vol. 71, No. 1, pp. 177-179 (Jan. 1983).

Taylor, James H., "Describing Functions", Electrical Engineering Encyclopedia (1999).

Troyanovsky, Boris, "Frequency Domain Algorithms for Simulating Large Signal Distortion in Semiconductor Devices", Dissertation, Stanford University (1997).

* cited by examiner

METHODS AND APPARATUS FOR COMPUTING AND USING A SPECTRAL MAP FOR PERFORMING NONLINEAR CALIBRATION OF A SIGNAL PATH

BACKGROUND

Electronic instruments, such as wide-band electronic instruments used in the test and measurement of electronic devices under test (DUTS), typically need to be calibrated. Examples of electronic instruments are 1) an arbitrary waveform generator (ARB), the core of which typically comprises a digital-to-analog converter (DAC), or 2) a receiver such as an oscilloscope, the core of which typically comprises an analog-to-digital converter (ADC). Around the core functionality of an electronic instrument, there typically exist a number of other devices, such as conditioning electronics (e.g., filters and amplifiers) and frequency translation devices (e.g., mixers for up-conversion and down-conversion of signals of interest).

A signal that is transmitted from, to or between electronic instruments can be processed through several stages in its transmission or reception. For instance, in a typical application, such as the testing of a radio frequency (RF) amplifier, an initial test signal could be generated by a baseband ARB, filtered, upconverted by a mixer, and then subjected to further amplification and filtering before its application to a DUT. An output test signal that is generated by the DUT, in response to the initial test signal, may then be received by a measurement instrument such as an oscilloscope or spectrum analyzer. Due to non-idealities in the electronics of the transmission and reception paths, the signals transmitted to and from the DUT may undergo distortions. Calibration refers to the processes that are applied to physical or mathematical signal representations in an attempt to remove or minimize these distortions.

Distortion of a signal may be classified as linear or nonlinear. Linear calibration of an electronic instrument is common, and is typically accomplished by adjusting the phase and amplitude of an excitation signal. This compensation is perhaps best understood in the frequency domain. That is, any signal can be represented in the frequency domain by considering a Fourier deposition (either a continuous decomposition using the Fourier Transform, or a discrete decomposition using the so-called discrete Fourier transform (DFT) of the signal of interest. See, e.g., Julius O. Smith III, "Mathematics of the Discrete Fourier Transform (DFT), with Audio Applications—Second Edition", W3K Publishing (2007). By a fundamental property of linear systems, linear distortion results in a signal with exactly the same frequency components as the undistorted signal—however, linear distortion can cause a shift in the phase and amplitude of each frequency component. When an input signal is represented (in the frequency domain) as a collection of complex numbers known as "phasors," linear distortion can be viewed as a transformation that scales and rotates each input phasor. In the time domain, linear calibration is typically accomplished by the construction of a finite impulse response (FIR) filter, which is constructed to satisfy frequency domain constraints. In practice, an 'impulse response' is typically used to estimate the linear distortion of a signal, and an appropriate FIR filter is used for linear calibration. Because of the importance of linear calibration procedures, the National Institute of Standards (NIST), has studied the linear calibration problem in detail and set forth standards for linear calibration processes and signals for some measurement instruments. See, e.g., William L. Gans, "Dynamic Calibration of Waveform Recorders and Oscilloscopes Using Pulse Standards", IEEE Transactions on Instrumentation and Measurement, Vol. 39, No. 6, pp. 952-957 (December 1990).

A hallmark of nonlinear distortion is the creation of energy at frequencies distinct from the frequency of the input signal. In one form, nonlinear distortion can result from a so-called squaring law. That is, if a signal has energy at a frequency $f_1$, then the squaring process in the time domain $y(t)=x(t)^2$ leads to energy, or signal distortion, at twice the input frequency (i.e., at $2*f_1=f_2$). Informally, nonlinear distortion leads to so-called "spurs" in the frequency domain. These spurs are easily viewed using a power spectrum analyzer. See, e.g., "Agilent PSA Performance Spectrum Analyzer Series—Optimizing Dynamic Range for Distortion Measurements", Agilent Technologies, Inc., (2000).

The importance of spurs in limiting the performance of electronic instruments is well-known, and is commonly quantified by the so called "spurious free dynamic range" (SFDR), usually provided as a key metric for measurement instrument performance. SFDR is also the subject of various Institute of Electrical and Electronics Engineers (IEEE) standards for uniform measurement. See, e.g., E. Balestrieri, et al., "Some Critical Notes on DAC Frequency Domain Specifications", XVIII Imeko World Congress (2006). Consideration of higher order nonlinear interactions (e.g., third order interactions) shows that nonlinear distortion can also cause distortion at or near the input excitation frequencies. This distortion is in addition to any linear distortion, and is often referred to as "intermodulation distortion", because it arises from signal mixing processes inherent in nonlinear signal interactions. Intermodulation distortion can complicate signal transmission and reception considerably, because it needs to be untangled from the underlying signal and its linear distortion.

Real-world electronic systems are also subject to a range of effects (e.g. oscillator feed through, electronic component operation, dependencies on temperature) that can cause a wide range of signal impairments and distortions that often need to be systematically accounted for and corrected (or avoided) during a calibration process. A brief overview of some of these effects and considerations for ARBs is described by Mike Griffin, et al. in "Conditioning and Correction of Arbitrary Waveforms—Part 1: Distortion", High Frequency Electronics, pp. 18-28 (August 2005) and in "Conditioning and Correction of Arbitrary Waveforms—Part 2: Other Impairments", High Frequency Electronics, pp. 18-26 (September 2005).

BRIEF DESCRIPTION OF THE DRAWINGS

Illustrative embodiments of the invention are illustrated in the drawings, in which:

FIGS. 11A, 11B, 11C, 11D, 11E and 11F illustrate the exemplary application of a multi-tone signal to the apparatus shown in FIG. 5;

FIGS. 12A, 12B, 12C, 12D, 12E and 12F illustrate the exemplary application of a pseudo-random signal to the apparatus shown in FIG. 5;

DETAILED DESCRIPTION

Figure 1:
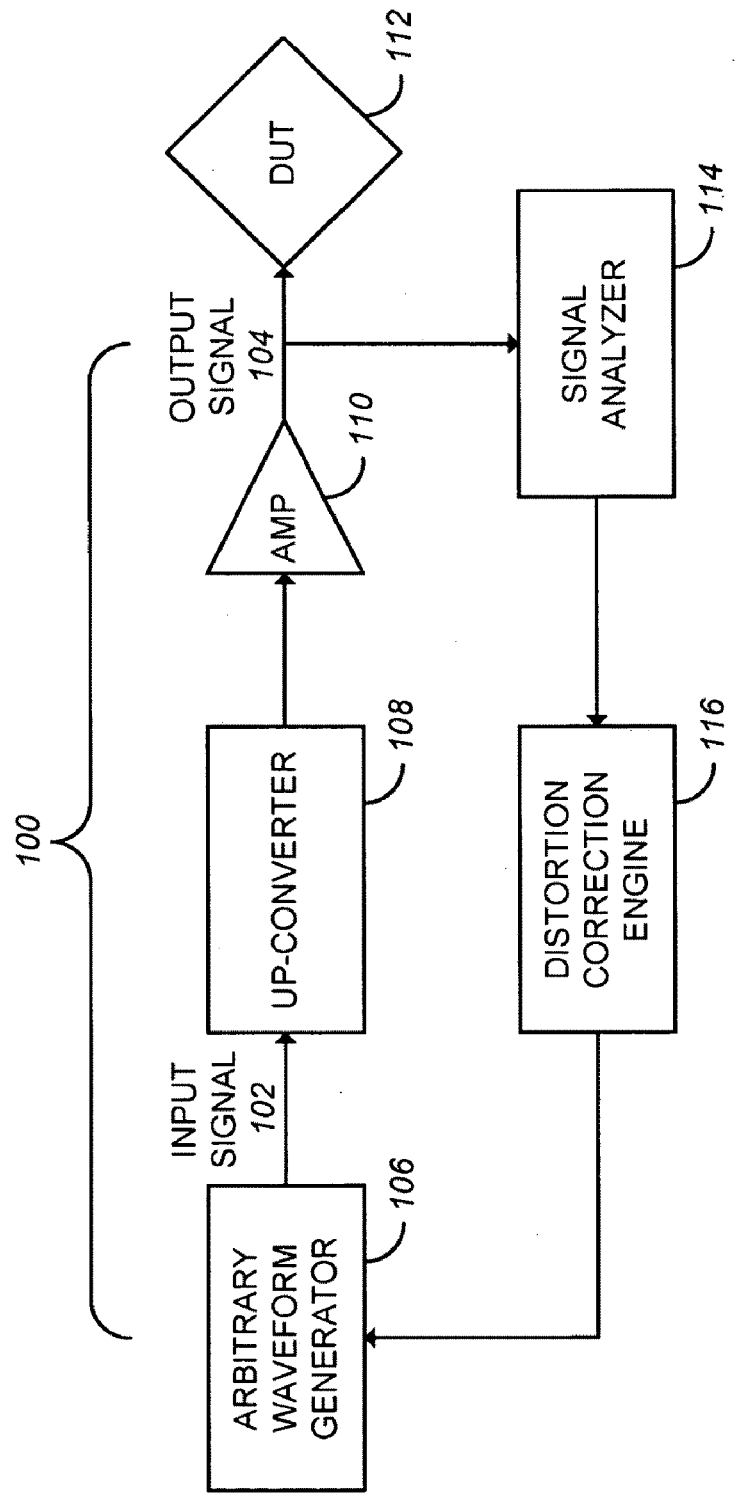
FIG. 1 illustrates an exemplary signal path comprising an ARB, an upconverter and an amplifier.

Linear calibration, temperature calibrations and other signal distortion corrections are commonly performed for electronic instruments. To date, methods for performing nonlinear calibration of electronic instruments have not been as common.

Described herein are methods and apparatus for performing nonlinear calibration of a signal path, including a signal path through one or more electronic instruments or devices. The performance of an electronic instrument or device, as measured by its spurious free dynamic range (SFDR), is typically limited by coherent nonlinear effects that are significantly above the inherent noise floor of the instrument or device. Nonlinear calibration provides a method that corrects for these effects, thereby extending the useable SFDR of the instrument or device.

For instance, and as will be described in more detail later in this description, an electronic instrument consisting of an arbitrary waveform generator (ARB) and an amplifier could have a SFDR of 65 dBc before nonlinear calibration, but have an SFDR of 80 dBc after nonlinear calibration. This increased dynamic range has many potential uses. For instance, if the ARB is being used to test an ADC with an SFDR of 70 dBc, then increasing the SFDR can enable more accurate testing of the ADC. Any calibration that increases the dynamic range, bandwidth, or fidelity of a transmitter or receiver typically translates directly into tangible useful results for test and measurement systems.

The novel methods and apparatus described herein use a 'nulling method' and predistortion to remove nonlinear spurs in an electronic instrument's output. Although the use of nulling methods are well-known, they are not commonly employed, because the number of spurs generated by an arbitrary test signal is typically too complex to be measured in a reasonable time. That is, there are typically just too many spurs for a nulling method to be practical for anything but one or a few periodic excitation tones. However, the methods and apparatus described below solve this problem by providing a calibration method that is based on a behavioral model. The behavioral model maps input signals (in the frequency domain) to output signals (including all spurs above a pre-specified signal level). A behavioral model is very useful for calibration because it does not require detailed measurements of each spur, but rather generates information of 'sufficient' accuracy about the frequency, phase, and amplitude of each spur, allowing the creation of a nulling signal to be created for nonlinear distortion.

Before describing novel methods and apparatus for performing nonlinear calibration of a signal path in detail, it is useful to consider some of the differences between existing linear and nonlinear calibration methods, and to consider some of the deficiencies of existing nonlinear calibration methods.

Linear calibration methods are greatly aided by the theory and practical experience in estimating the linear 'transfer function' of an electronic device. Indeed, the use of 'impulse response testing' to gauge linear distortion is a direct expression of the well-studied theory of linear transforms, Dirac delta functions, and the general solution (via the Laplace transform) of linear systems. See, Gans, supra. A similar theory does not exist for nonlinear systems—hence the difficulty in performing nonlinear calibration. The closest theory, the so-called Volterra theory, is described in detail, for instance, by Stephen P. Boyd, "Volterra Series, Engineering Fundamentals", Dissertation, U. C. Berkeley (1985). However, despite many years of research, its practical application, to date, has been somewhat limited (unlike the linear transfer function theory). Application of the Volterra theory has been limited for several reasons, such as, because the theory is only applicable to 'weak' nonlinearities, and because, from a practical point of view, the estimation of the full Volterra kernels has not proven practical since it involves an enormous number of measurements to capture wide-band frequency domain effects. Thus, though very insightful from a theoretical point of view, Volterra series have generally not proven practical for typical engineering applications involving signal corrections (that is, without significant simplifications). These inherent problems are only accentuated for calibration problems, where the speed at which measurements are taken and calibration is performed are usually at the forefront.

In comparison to complex calibration methods based on the Volterra theory, other calibration methods are sometimes based on 'Look Up Tables' (LUTs). Calibration methods based on LUTs compare the measured performance of an instrument or device to an expected 'ideal' performance and are a common engineering solution. However, LUTs are not a practical solution for typical nonlinear calibration, because the output signal of an instrument typically depends in a complex fashion on an input signal, and it is generally not feasible to measure the actual instrument response to a complete sample of operating conditions and input signals. In more practical terms—effective nonlinear calibration involves the location and estimation (in both phase and magnitude) of each significant output signal spur. For known test signals, a calibration based on LUTs might be applicable. Calibration based on LUTs is a common staple of calibration procedures for some causes of signal distortion (e.g. temperature calibration). However, one of the characteristics of a nonlinear system is that its output is a function of an input signal, and there is no general way to deconvolve the system's response from a wide range of different input signals.

From a metrology point of view, nonlinear calibration requires an accurate and detailed knowledge of both the amplitude and phase of each nonlinear spur of interest. Accurate amplitude measurements are typically straight-forward using a power spectrum analyzer. Phase measurements are also possible, assuming that the signal of interest can be digitized (i.e., the full time domain signal can be captured), and that the digitized signal has sufficient dynamic range to measure signal distortions of interest. Unfortunately, typically one or both of these assumptions fails for high dynamic range measurement instruments or devices, and this requires the development of alternative metrology techniques to recover the phase and amplitude information of nonlinear distortion. This forces the use of some sort of 'frequency domain measurement instrumentation' for the recovery of phase information of low level signal distortions.

The National Institute of Standards and Technology (NIST) has looked at some preliminary methods for nonlinear calibration, which allow the accurate recovery of the phase of nonlinear instruments or devices. These methods include the 'nose-to-nose' method, as well as measurement systems utilizing wide-bandwidth, accurate phase reference generators. See, e.g., Tracy S. Clement, et al., "Calibration of Sampling Oscilloscopes With High-Speed Photodiodes", IEEE Transactions on Microwave Theory and Techniques, Vol. 54, No. 8, pp. 3173-3186 (August 2006). Such systems demonstrate the fundamental metrology methods needed for nonlinear calibration, but neither the measurement systems, nor the methods, have proven practical in terms of cost and time for wide-spread use.

Lastly, it is common practice in electronic design to minimize the effect of nonlinear spurs as part of the initial design process for an electronic chip. For example, several techniques are employed to minimize any coherent nonlinear signals. See, e.g., Russ Radke, et al., "A Spurious-Free Delta-Sigma DAC Using Rotated Data Weighted Averaging", IEEE Custom Integrated Circuits Conference, pp. 125-128 (1999). However, despite the best design techniques, significant nonlinear spurs often still appear in the chip's output(s).

The novel methods and apparatus described below utilize signal predistortion to accomplish nonlinear calibration of a signal path. There is a great deal of research on predistortion and its applications to solve various electronic signal integrity issues. Perhaps the most common application of predistortion is to increase the fidelity of electronic transmission and reception systems, in particular cellular phone base stations and handset electronics. See, e.g., Rahul Gupta, et al., "Adaptive Digital Baseband Predistortion for RF Power Amplifier Linearization", High Frequency Electronics, pp. 16-25 (September 2006). However there have been far fewer applications of predistortion to nonlinear calibration of electronic instruments.

The novel methods and apparatus described herein differ significantly from a Volterra approach. One reason is because the methods and apparatus are constrained early on to a fixed "frequency set" (as will be described in more detail later). Put more simply, the novel methods and apparatus disclosed herein focus on predicting and removing particular output signal spurs in the frequency domain, instead of building the large models prescribed by the Volterra theory and attempting to remove all spurs.

The novel methods and apparatus disclosed-herein accomplish predistortion using a spectral map. The concept of a spectral map is straight-forward, though its details can become enormously cumbersome. This is why the methods and apparatus disclosed herein utilize a behavioral modeling approach for approximating (or estimating) the appropriate content for a spectral map.

An input signal to a device (or DUT) may be represented in the frequency domain by means of a discrete Fourier transform (DFT). Let $u(t)$ be the input signal and $U(k)$ be its discrete Fourier Transform. See, e.g., Smith III, supra. If $u(t)$ is a multitone signal, then:

$$u(t) = \sum_{k=-N}^{N} U(k) \exp\left(j2\pi \frac{k}{N} f_{max} t\right), \quad (1)$$

where $U(k)=U^*(-k)=|U(k)|\exp(j\phi_k)$, and where $f_{max}$ is the maximum frequency of excitation. Factoring out the time dependence, the above representation of the signal is typically called the 'phasor' representation, because a real signal is represented geometrically as complex numbers with phase $\phi_k$ and amplitude $A_k=|U(k)|$. Using the Euler identity, it can be written that $$A\cos(\omega t + \delta) = A\frac{1}{2}[\exp(\omega t + \delta) + \exp(-\omega t - \delta)],$$

thereby making it easy to see the input signal's two-sided DFT spectrum. Representing the input signal $U(k)$ in the frequency domain, the nonlinear dependence of an output signal ($y(t)$ in the time domain, and $Y(k)$ in the frequency domain) on the input signal can be described in the frequency domain, for either a range of frequencies or a fixed output frequency, as:

$$Y(k)=G[U(k)], \quad (2)$$

where G is a nonlinear operator. G may also be referred to as a "spectral map", because it effectively maps input phasors in the frequency domain to output phasors in the frequency domain. An inverse discrete Fourier transform (IDFT) may be used to recover the time domain signals $u(t)$ and $y(t)$. The idea of examining spectral maps for the purpose of modeling nonlinear systems is essentially the idea behind the 'describing function' theory for approximating nonlinear systems. See, e.g., James H. Taylor, "Describing Functions", Electrical Engineering Encyclopedia (1999). Spectral maps also play a key role in electronic simulation technologies such as 'harmonic balance methods' and the 'methods of spectral balance'. See, e.g., Nuno Borges de Carvalho, et al., "Simulation of Multi-Tone IMD Distortion and Spectral Regrowth Using Spectral Balance", IEEE MTT-S Digest, pp. 729-732 (1998).

The idea of a spectral map can be better understood with some examples. Consider, for example, a spectral map up to third order (NL3) with delay (memory) terms. In the time domain, this spectral map has the form:

$$y_{NL3}(t) = a_1 x(t-\tau_1) + a_2 x^2(t-\tau_2) + a_3 x^3(t-\tau_3). \quad (3)$$

Now consider the output of this spectral map, subject to the two-tone signal $x(t)=\cos(\omega_1 t)+\cos(\omega_2 t)$. For simplicity sake, assume unit magnitude for each amplitude and initially zero phase offset (although when building real behavioral models, these assumptions are not made). Using Euler's identity, the signal $x(t)$ can be written in terms of 'phasors' as:

$$x(t-\tau_1) = \frac{1}{2}(\exp(i\omega_1 t - i\tau_1) + \exp(-i\omega_1 t + i\tau_1)) + \quad (4)$$
$$\frac{1}{2}(\exp(i\omega_2 t - i\tau_1) + \exp(-i\omega_2 t + i\tau_1)),$$

and the spectral map of first, second, and third order (in no particular coherent arrangement) can be written as:

$$y_1(t) = a_1 \cdot \left(\frac{1}{2} e^{i\tau_1 - i\omega_1} + \frac{1}{2} e^{i\omega_1 - i\tau_1} + \frac{1}{2} e^{i\tau_1 - i\omega_2} + \frac{1}{2} e^{i\omega_2 - i\tau_1}\right) \quad (5)$$

-continued $$y_2(t) = a_2 \cdot \begin{pmatrix} 1 + \frac{1}{4}e^{2i\tau_2 - 2it\omega_1} + \frac{1}{4}e^{2it\omega_1 - 2i\tau_2} + \\ \frac{1}{4}e^{2i\tau_2 - 2it\omega_2} + \frac{1}{2}e^{2i\tau_2 - it\omega_1 - it\omega_2} + \\ \frac{1}{2}e^{it\omega_1 - it\omega_2} + \frac{1}{2}e^{it\omega_2 - it\omega_1} + \frac{1}{2}e^{-2i\tau_2 + it\omega_1 + it\omega_2} + \\ \frac{1}{4}e^{2it\omega_2 - 2i\tau_2} \end{pmatrix}$$

$$y_3(t) = a_3 \cdot \begin{pmatrix} \frac{1}{8}e^{3i\tau_3 - 3it\omega_1} + \frac{9}{8}e^{i\tau_3 - it\omega_1} + \frac{9}{8}e^{it\omega_1 - i\tau_3} \\ + \frac{1}{8}e^{3it\omega_1 - 3i\tau_3} + \frac{1}{8}e^{3i\tau_3 - 3it\omega_2} + \\ \frac{3}{8}e^{3i\tau_3 - it\omega_1 - 2it\omega_2} + \frac{3}{8}e^{i\tau_3 + it\omega_1 - 2it\omega_2} + \frac{9}{8}e^{i\tau_3 - it\omega_2} \end{pmatrix} +$$

$$a_3 \cdot \begin{pmatrix} \frac{3}{8}e^{3i\tau_3 - 2it\omega_2 - it\omega_1} + \frac{3}{8}e^{-i\tau_3 + 2it\omega_1 - it\omega_2} + \frac{9}{8}e^{it\omega_2 - i\tau_3} + \\ \frac{3}{8}e^{i\tau_3 - 2it\omega_1 + it\omega_2} + \frac{3}{8}e^{-3i\tau_3 + 2it\omega_1 + it\omega_2} + \\ \frac{3}{8}e^{-i\tau_3 - it\omega_1 + 2it\omega_2} + \frac{3}{8}e^{-3i\tau_3 + it\omega_1 + 2it\omega_2} \end{pmatrix} +$$

$$a_3 \cdot \left( \frac{1}{8}e^{3it\omega_2 - 3i\tau_3} \right)$$

Equation (5) is useful for reading frequency domain information. For instance, all terms at the frequency $2\omega_1 + \omega_2$ can be grouped to find contributions of the map to this particular frequency bin, as:

$$y((2\omega_1 + \omega_2)t) = \frac{3}{8}[e^{i(2\omega_1 + \omega_2)t - 3i\tau_3} + e^{-i(2\omega_1 + \omega_2)t + 3i\tau_3}] \quad (6)$$

$$= \frac{3}{4}\cos((2\omega_1 + \omega_2)t - 3\tau_3)$$

So, even in the simplest case of a polynomial, some of the complexity of a spectral map is revealed. Only a few cases, such as (static) power laws, are capable of closed form analytic solutions. See, e.g., Michael B. Steer, et al., "An Algebraic Formula for the Output of a System with Large-Signal, Multifrequency Excitation", Proceedings of the IEEE, Vol. 71, No. 1, pp. 177-179 (January 1983). In general, the output to a given frequency component, for a fixed model, depends on a weighted sum of the input phasors determined by a (model dependent) set of coefficients, as well as the original amplitude and phases of the input tones relative to one another. Thus, solving analytically for a spectral map of a multidimensional time-dependent nonlinear system is beyond the capability of modern science—though its simulation, given a fixed model, is straightforward (if somewhat cumbersome).

A brief review of Volterra theory is helpful to understand the full complexity of the problem of developing spectral maps. For a class of non-linear causal time-invariant system (roughly, systems for which there exist unique steady states), the output of such a system can be formally represented (meaning that it is mathematically true, but perhaps not of much practical use) by a non-linear operator:

$$y(t) = F[u(t)] = \sum_{n=0}^{\infty} y_n(t), \quad (7)$$

where $y_n(t) = \int \ldots \int h_n(\tau_1, \tau_2, \ldots, \tau_n) u(t-\tau_1) \ldots u(t-\tau_n) d\tau_1 d\tau_2 \ldots d\tau_n$, and where $h_n$ is called the nth-order (time domain) Volterra kernel (see Boyd, supra). The details are omitted here, but the above (formal) solution can be transformed to one with frequency domain Volterra kernels (see Boyd, supra), yielding:

$$y_n(t) = \sum_{i_1=-m}^{m} \sum_{i_2=-m}^{m} \ldots \sum_{i_n=-m}^{m} a_{i_1} a_{i_2} \ldots a_{i_n} H_n(j\omega_{i_1}, j\omega_{i_2}, \ldots, j\omega_{i_n}) \exp\left(j \sum_{k=1}^{n} \omega_{i_k} t\right), \quad (8)$$

where $$u(t) = \sum_{i=-n}^{n} a_i$$

$\exp(j\omega_i t)$ it is an input test signal. The reason this form of the Volterra solution is of interest is that it makes explicit the fact that any (but the most trivial) spectral map will have the property that the output signal depends on the amplitude and phase of the input signal. Put another way, any behavioral model of a system should 1) keep track of the (relative) phases and amplitudes of components of the input signal, and 2) explicitly use this information in modeling the system. That is, an amplitude model alone will usually be inadequate. Further exercises show that the dependence on phase can be quite sensitive. In fact, for many input signals, errors of 0.01 radians in the phase of the input signal can translate into amplitude errors of a factor of two in the output signal. Thus, from a metrology standpoint, nonlinear behavioral modeling requires precise measurement of the (relative) phases of harmonic components, in order to develop and verify a behavioral model for use in nonlinear calibration.

To finish this discussion of Volterra theory, it is noted that the spectral map for a (formal) Volterra solution, up to third order, can be written as:

$$Y(k) = Y^{(1)}(k) + Y^{(2)}(k) + Y^{(3)}(k) \quad (9)$$

$$= G_k^1 \cdot U(k) + \sum_{k_1=-N}^{N} G_{k_1,k-k_1}^2 \cdot U(k_1) \cdot U(k-k_1) +$$

$$\sum_{k_1=-N}^{N} \sum_{k_2=-N}^{N} G_{k_1,k_2,k-k_1-k_2}^3 \cdot U(k_1) \cdot U(k_2) \cdot U(k-k_1-k_2),$$

where $k=1, 2, 3, \ldots, 3N$, and where $U(k)$ and $Y(k)$ are the Fourier coefficients of the input and output signals. Note that factorization of the frequency domain Volterra kernel into 'products' (or a sequence of one-dimensional convolutions), similar to those in the time domain, is a non-trivial exercise. See, e.g., Gil M. Raz, et al., "Baseband Volterra Filters for Implementing Carrier Based Nonlinearities", IEEE Transactions on Signal Processing, Vol. 46, No. 1, pp. 103-114 (January 1998). Also note that the $G_k^1$ is the frequency domain representation of the linear transfer function, sometimes also called the 'frequency response function.' The G's can be thought of as containing all of the information about the 'distortion' products, because they can be formally factored in the Volterra formulation, from the input signal, just like the linear transform function. The difficulty, though, in using this formulation to build behavioral models (besides the inherent limits of its mathematical assumptions such as 'weak nonlinearity') is the enormous number of measurements needed to estimate the frequency domain Volterra kernels, which proceeds like $O\{N\}+O\{N^2\}+O\{N^3\}$ in the third order case. For example, assuming a 1 Mhz spacing, a 1 Ghz wide linear transfer function can be estimated with 1000 single tone measurements, while $G^2$ requires $1000^2$ measurements, and $G^3$ requires $1000^3$ measurements. An empirical 'recipe' for more quickly building a model for a spectral map is therefore described below.

FIG. 1 illustrates an exemplary signal path 100. The signal path 100 comprises an ARB 106, an optional upconverter 108 coupled to the output of the ARB 106, an amplifier 110 coupled to the output of the upconverter 108, and a DUT coupled to an output of the amplifier 110. An input signal 102 is applied to the signal path 100 by the ARB 106, and an output of the signal path 100 generates an output signal 104 for application to a DUT 112. A signal analyzer 114 samples the output signal 104; and a distortion correction engine 116 predistorts the input signal 102 in the frequency domain, in accord with a spectral map. Of note, the graphs and screenshots shown in the drawings, and referenced herein, provide exemplary data for a signal path 100 that does not include the optional upconverter 108.

Figure 2:
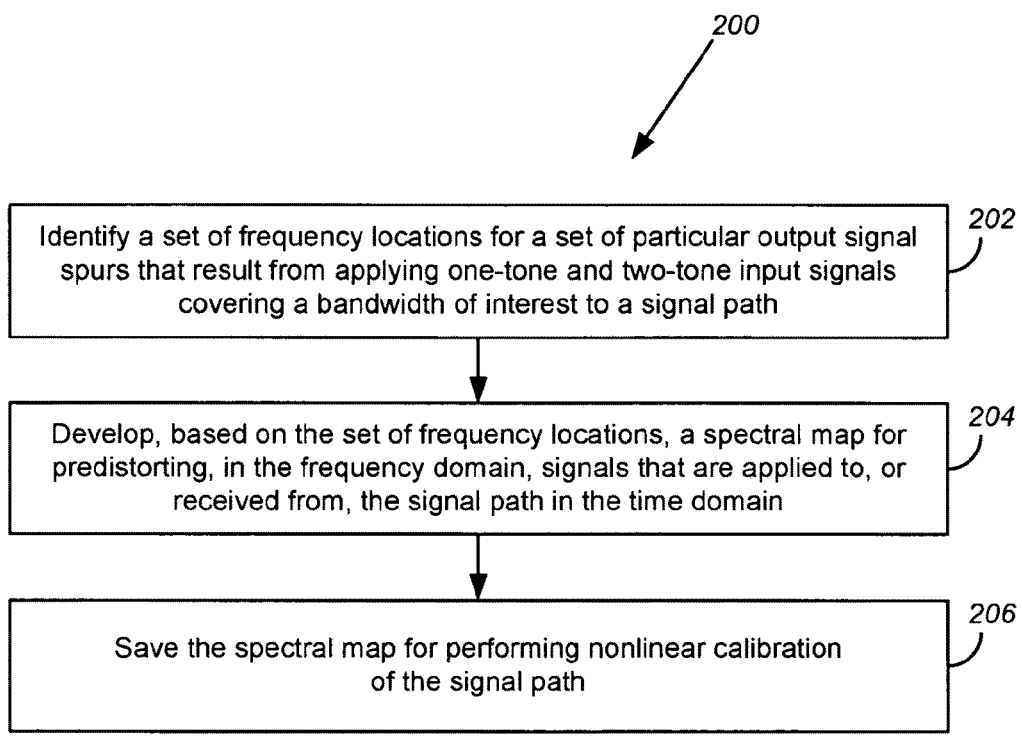
FIG. 2 illustrates an exemplary method for developing a spectral map for performing nonlinear calibration of a signal path.

FIG. 2 illustrates an exemplary method 200 for developing a spectral map for performing nonlinear calibration of a signal path 100. The method 200 begins with the identification of a set of frequency locations for a set of particular output signal spurs that result from applying one-tone and two-tone input signals covering a bandwidth of interest to the signal path (at step 202). The set of frequency locations, or "frequency set", may be identified by performing a power spectral scan over the bandwidth of interest.

After identifying the set of frequency locations in step 202, a spectral map is developed based on the set of frequency locations (at step 204). The spectral map is developed for predistorting, in the frequency domain, signals that are applied to, or received from, the signal path in the time domain.

Ultimately, the spectral map developed in step 204 may be saved for performing nonlinear calibration of the signal path 100.

Figure 3:
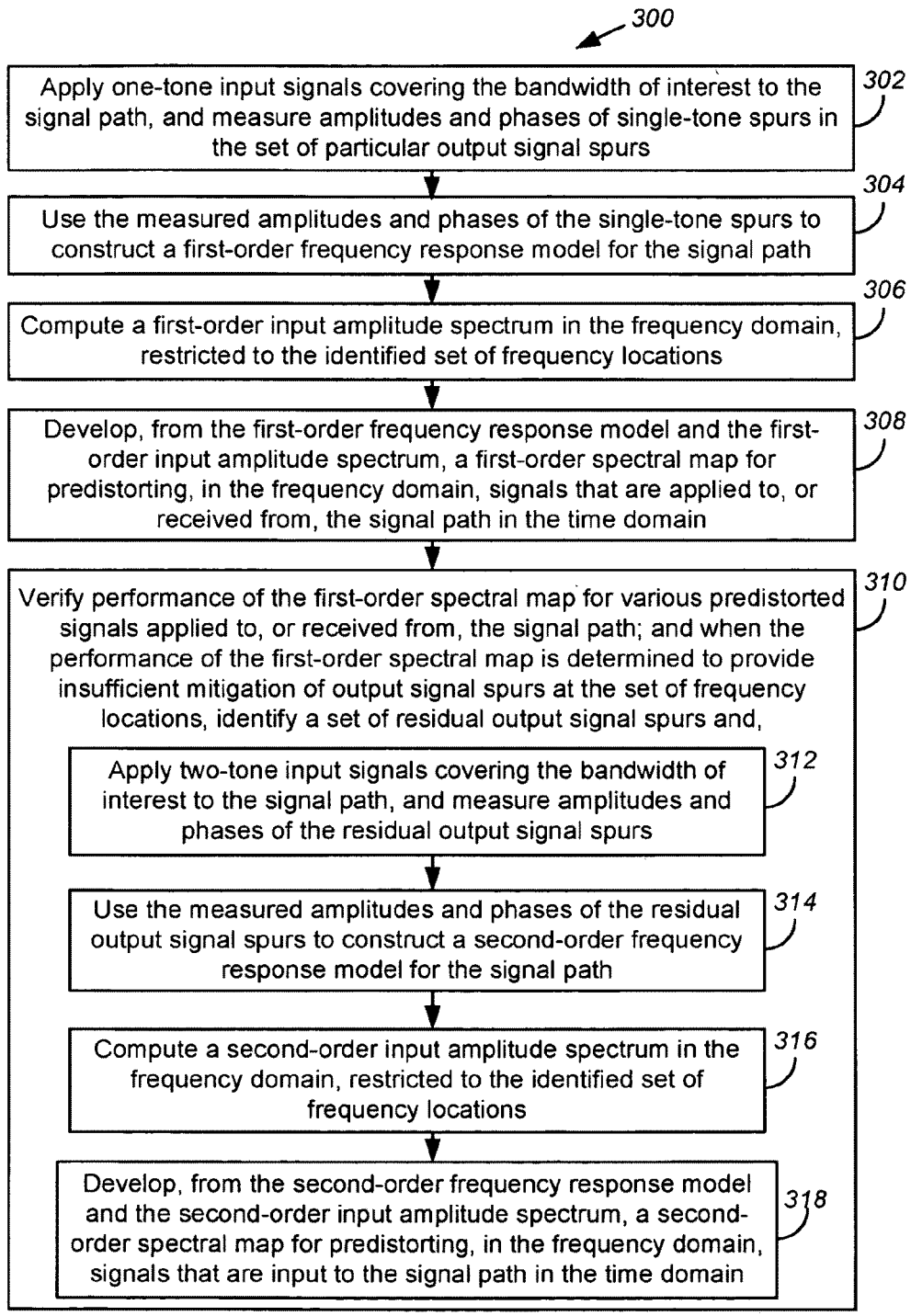
FIG. 3 illustrates an exemplary way to develop the spectral map used by the method shown in FIG. 2.

FIG. 3 illustrates an exemplary way to develop the spectral map referenced by the method 200 (FIG. 2). The method 300 begins with 1) the application of one-tone input signals covering the bandwidth of interest to the signal path 100, and 2) the measurement of amplitudes and phases of single-tone spurs in the set of particular output signal spurs (at step 302). The measured amplitudes and phases of the single-tone spurs are used to construct a first-order frequency response model for the signal path 100 (at step 304). In some cases, the model may be extended to arbitrary input tones by applying appropriate power law, amplitude and phase scaling relationships.

The method 300 continues with the computation (e.g., by formula or algorithm) of a first-order input amplitude spectrum in the frequency domain (at step 306; see input amplitude spectrum U(k), Eq. 2). The input amplitude spectrum is restricted to the set of frequency locations identified in step 302.

From the first-order frequency response model and the first-order input amplitude spectrum, a first-order spectral map is developed for predistorting, in the frequency domain, signals that are applied to, or received from, the signal path 100 in the time domain (at step 308). This may be done by applying the first-order frequency response model constructed in step 304 to the input amplitude spectrum compute computed in step 306.

After developing and saving the first-order spectral map, the performance of the first-order spectral map may be verified for various predistorted signals that are applied to, or received from, the signal path 100 (at step 310). The signals that are applied to, or received from, the signal path 100 during verification may comprise one-tone, two-tone, multitone and pseudo-random signals.

When the performance of the first-order spectral map is determined to provide insufficient mitigation of output signal spurs at the set of frequency locations determined in step 202, a set of residual output signal spurs may be identified (at step 310). Then, two-tone input signals covering the bandwidth of interest may then be applied to the signal path, and amplitudes and phases of the residual output signal spurs may be measured (at step 312). The measured amplitudes and phases of the residual output signal spurs may be used to construct a second-order frequency response model for the signal path (at step 314); and a second-order input amplitude spectrum (($U(k_1) \cdot U(k-k_1)$) in Eq. 2) may be computed in the frequency domain (at step 316). The input amplitude spectrum is restricted to the set of frequency locations identified in step 302. From the second-order frequency response model and the second-order input amplitude spectrum, a second-order spectral map may be developed for predistorting, in the frequency domain, signals that are input to the signal path in the time domain (at step 318).

After developing and saving the second-order spectral map, the combined performance of the first-order spectral map and the second-order spectral map may be verified for various predistorted signals that are applied to, or received from, the signal path 100. The signals that are applied to, or received from, the signal path 100 during verification may comprise one-tone, two-tone, multitone and pseudo-random signals. Typically (band-limited) pseudo-random signals include those generated by digitial communications formats (such as code division multiple access (CDMA) signals) and (band-limited) pseudonoise (PN) sequences found in spread spectrum radar applications.

When the combined performance of the first-order spectral map and the second-order spectral map is determined to provide insufficient mitigation of output signal spurs at the set of frequency locations, an additional set of residual output signal spurs may be identified, and any of method steps 302-318 may be iteratively repeated to update the first-order spectral map or the second-order spectral map. Alternately (or additionally), a third or higher order spectral map may be developed in a manner similar to how the first and second-order spectral maps were developed.

The above methods 200, 300 develop a spectral map using an iterative approach. The iterative approach is guided by measurement data at two levels. First, the frequency response models of the signal path 100 are not constructed using the full frequency domain information specified in the Volterra model. Rather, the methods 200, 300 start with (a minimal set of wide-band) measurements of one and two-tone tests and attempt to apply these corrections to a wider set of input tones. Second, any residual errors (residual output signal spurs) in a second-order model are again based on a restricted set of two-tone measurements. In both cases, the detailed phase and amplitude information of an input signal is tracked, and is used as the input to any empirical spectral maps. The methods 200 and 300 are empirical, and need to be guided by and verified by experiments. Thus, the general utility of the methods 200 and 300 need to be examined on a case-by-case basis. In experiments, the methods 200 and 300 have provided good results when calibrating wide-band arbitrary waveform generators and surrounding conditioning electronics.

Intuitively, the methods 200 and 300 are guided by an attempt to use measurement data to whittle down the (frequency domain) model to a minimal set of tractable data and measurements. The methods 200 and 300 are based on an intuitive (simplifying) assumption that 'energy' in a given frequency band (constructed by computing an appropriate U(k) input signal spectrum) will get mapped in a similar way as the energy in one or two-tone mappings. That is, in the modeling process we start by building the simplest model possible, and then add refinements to this model based on residual output signal spurs.

Figure 4:
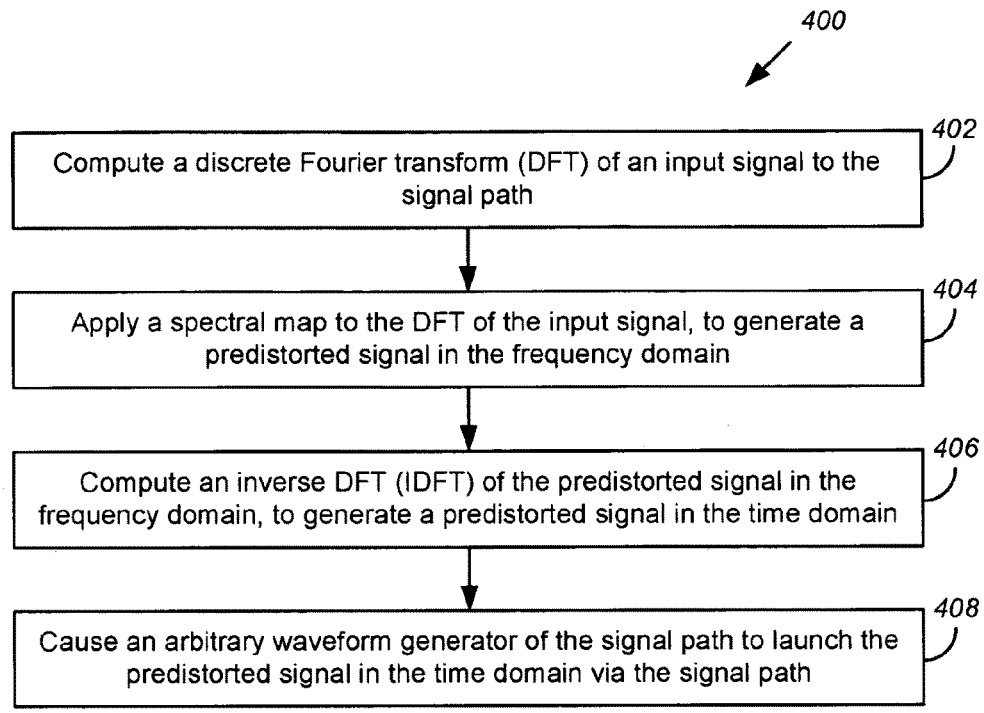
FIG. 4 illustrates an exemplary method for performing nonlinear calibration of a signal path.

Once a spectral map for performing nonlinear calibration of a signal path is determined, then it can be used to predistort arbitrary input signals. As shown by the method 400 illustrated in FIG. 4, the DFT of an input signal 102 may be computed (at step 402). The spectral map developed using method 300 or 400 is then applied to the DFT of the input signal, to generate a predistorted signal in the frequency domain (at step 404). The IDFT of the predistorted signal (in the frequency domain) is then computed to generate a predistorted signal in the time domain (at step 406). An arbitrary waveform generator is then caused to launch the predistorted signal (in the time domain) via the signal path 100 (at step 408). The input signal 102 that is subject to predistortion may be a periodic, multiperiodic or arbitrary waveform.

Figure 5:
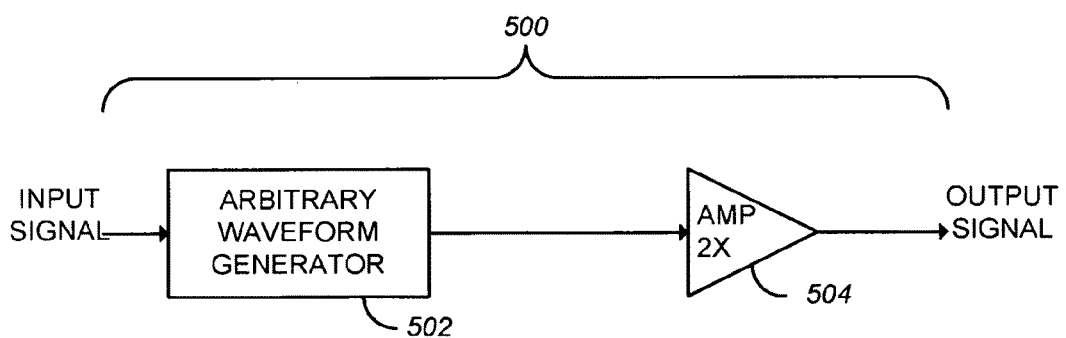
FIG. 5 illustrates an exemplary signal path comprised of a wide-band arbitrary waveform generator and a (2×) amplifier.

Further details and an exemplary application of the methods 200 and 300 will now be described. The exemplary application is nonlinear calibration of a signal path 500, through a wide-band arbitrary waveform generator 502 followed by a (2×) amplifier 504. See, FIG. 5.

In step 202 of the method 200 (FIG. 2), the 'frequency set' may be identified by performing a power spectral scan over the bandwidth of interest. One and two tone test signals are used. In the context of the signal path shown in FIG. 5, three sources of spurs where examined: (i) higher order harmonics as predicted by a static polynomial model (see Steer, supra), (ii) higher Nyquist zone harmonics that fold down to the first Nyquist band (see, e.g., Ryan Grouix, et al., "Minimization of DDS Spurious Content in Multi-Channel Systems", High Frequency Electronics, pp. 18-28 (October 2006)), and (iii) mixing with any internal spurs such as internal oscillator feed through (see Griffin, supra). In this example, the amplifier nonlinearities dominated, and the frequency locations of all spurs between 65 dBm and 90 dBm (and from 5-500 Mhz) for one and two tone tests were accurately predicted based on 2nd and 3rd order harmonics generated from a third order polynomial model, as hypothesized by distortion source (i). So, in this particular case, the locations of spurs can be predicted either by an analytic formula, or by simulation, based on a low-order polynomial model.

Figure 6:
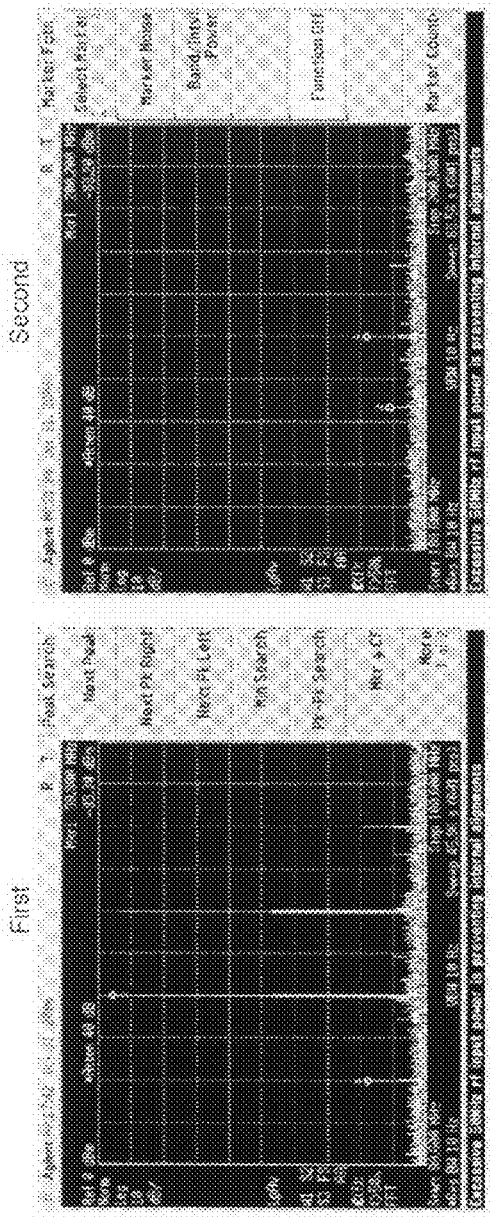
FIGS. 6A, 6B and 6C illustrate a two-tone input signal.
Figure 6:
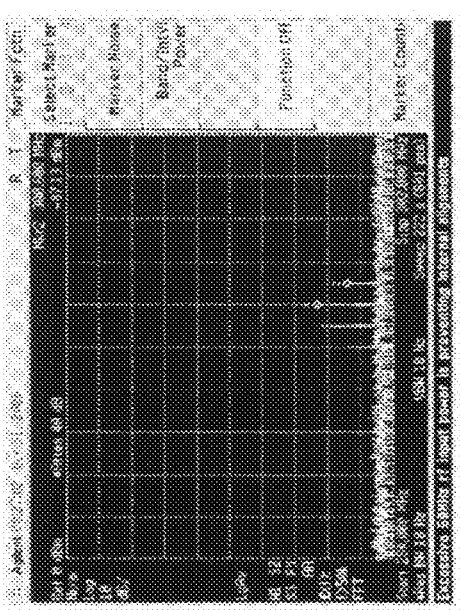

For example, FIGS. 6A and 6B show a two-tone input signal having tones at $f_1$ and $f_2=f_1+\Delta f$. All spurs above 90 dBm can be accounted by the sum and difference frequencies for a third-order model. A system without the amplifier requires including a formula for the higher Nyquist spurs as well (see Groulx, supra).

Figure 7:
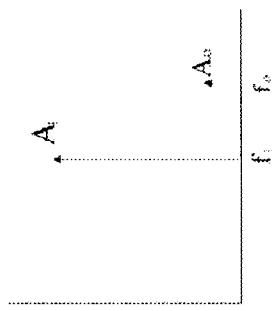
FIG. 7 illustrates exemplary measurements of the phase and amplitude of a single-tone spur.
Figure 7:
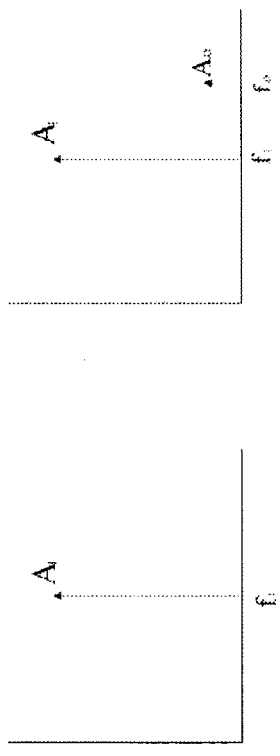
Figure 7:
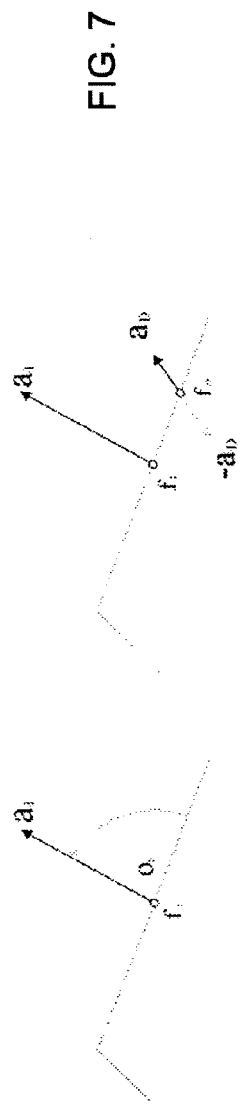
Figure 7:
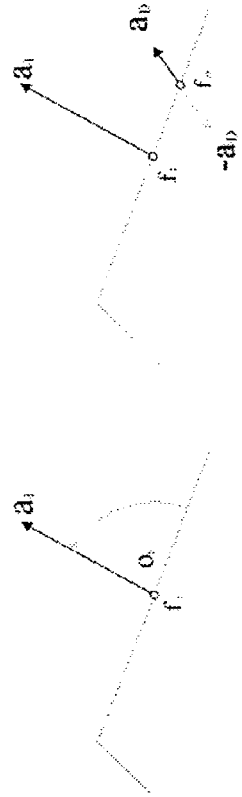
Figure 8A:
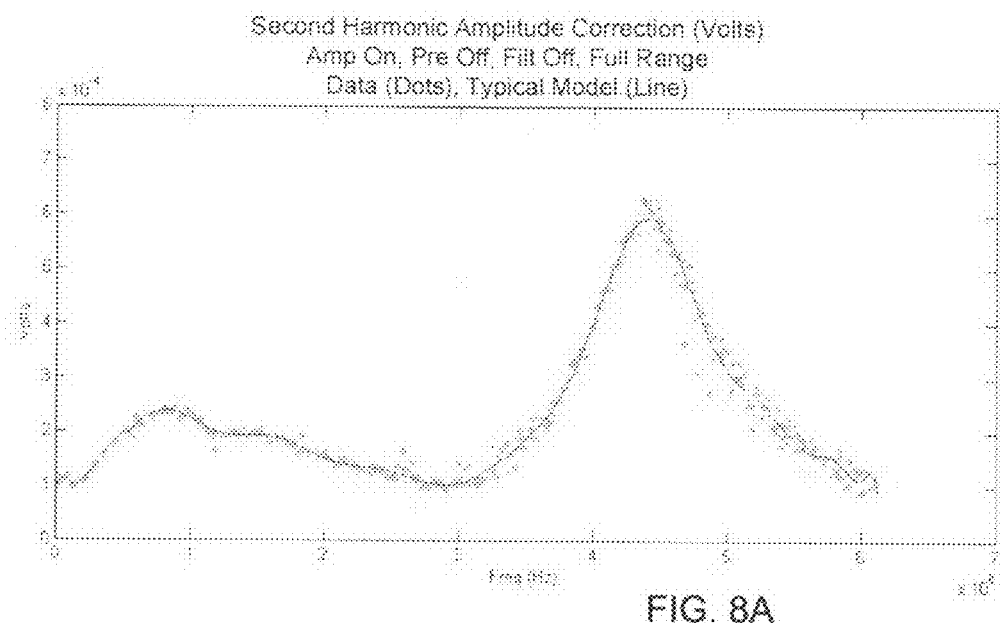
FIGS. 8A & 8B illustrate exemplary second order spur distortion data, and the fit of a low-order polynomial to the data.
Figure 8B:
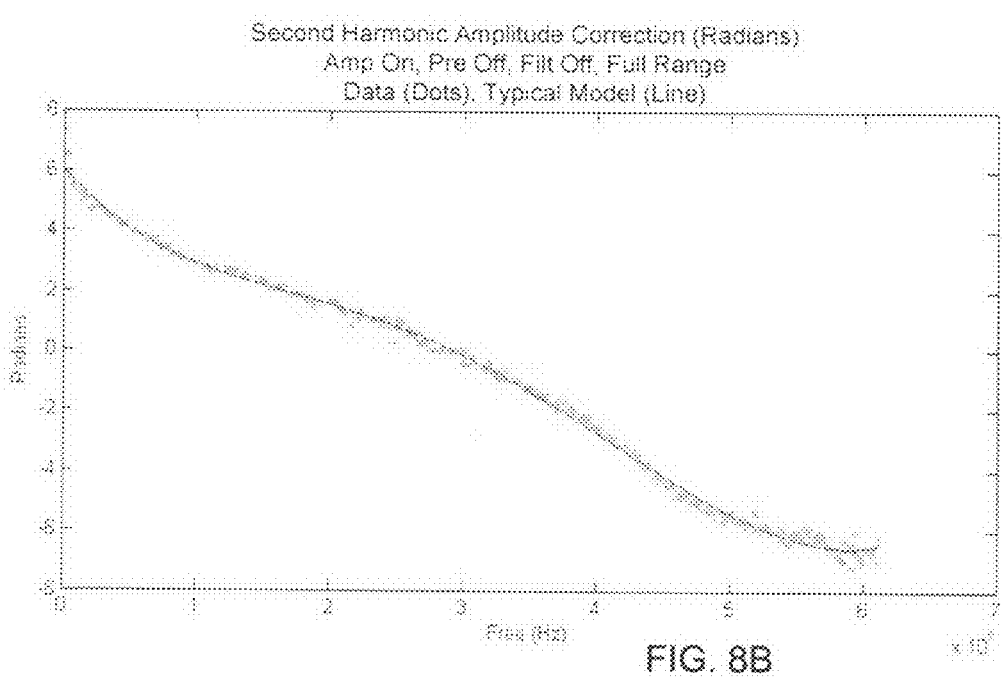
Figure 9A:
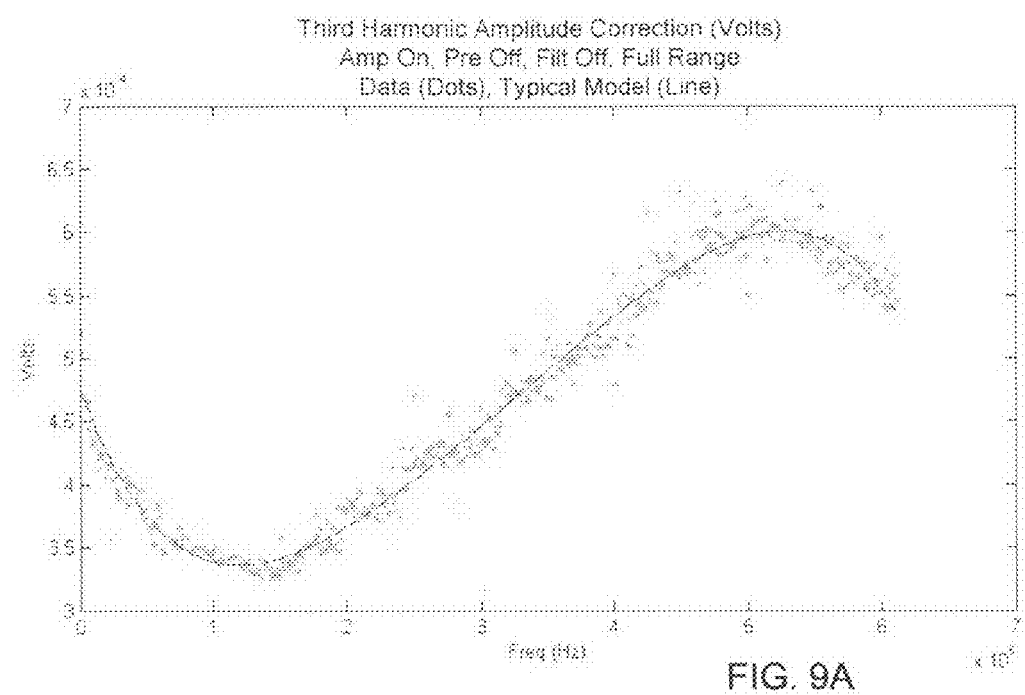
FIGS. 9A & 9B illustrate exemplary third order spur distortion data, and the fit of a low-order polynomial to the data.
Figure 9B:
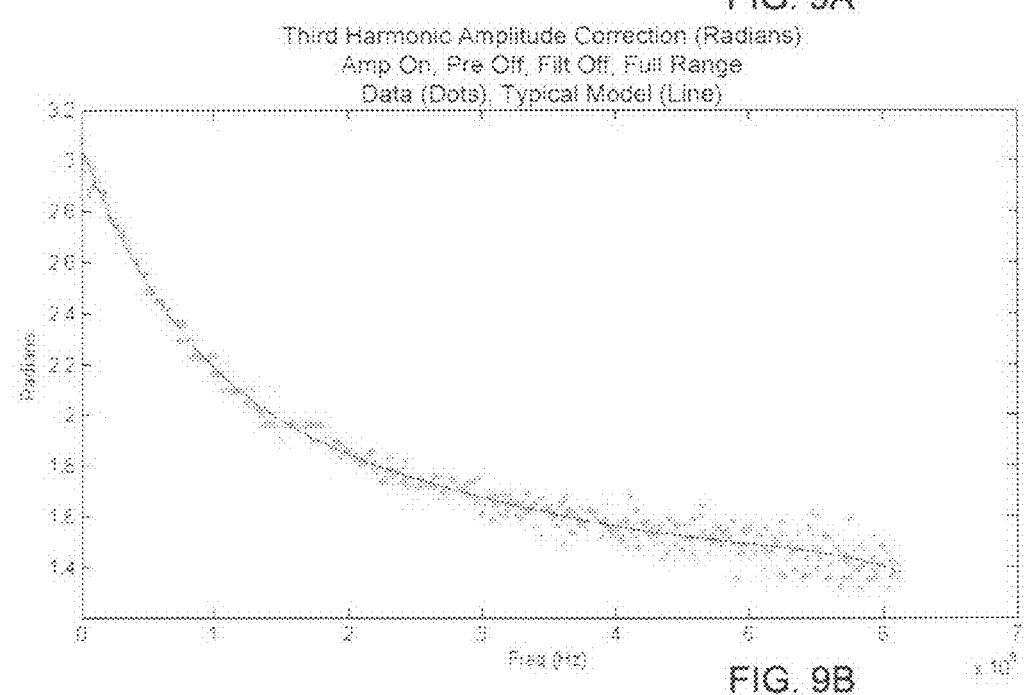

Step 302 of the method 300 (FIG. 3) requires the measurement in both phase and amplitude of the (nonlinear) distortion of a one-tone input signal, for the dominant terms in the frequency set identified in step 202. In the example considered in FIG. 5, this requires measuring, as illustrated in FIG. 7, both the phase and amplitude of single-tone spurs. A 'nuller' or nulling signal may be created by adding a spur signal—of the same magnitude but opposite phase—to the input of the arbitrary waveform generator. This type of signal correction process is called predistortion. This first level of modeling is similar to traditional AM/AM or AM/PM modeling, which measures the distortion of the input tone. These data are AM/AM and AM/PM 'like' models for the spurs generated by the input tone. See, e.g., Fadhel M. Ghannouchi, et al., "AM-AM and AM-PM Distortion Characterization of Satellite Transponders/Base Station Transmitters Using Spectrum Measurements", IEEE Conference Proceedings of Recent Advances in Space Technologies, pp. 141-144 (2003). The models are therefore called the 'second-order' and 'third-order' AM/AM, AM/PM models respectively. FIGS. 8A & 8B show the second order spur distortion data, and FIGS. 9A & 9B show the third order spur distortion data. To create a 'model,' a low-order polynomial may be fitted to the phase and amplitude distortion data. This is sufficient because the curves have few local critical points, and interpolation can be used to find the phase and amplitude response at a frequency within the upper and lower frequency bounds presented by the experimental data. Note that because a model is created in the frequency domain, the model—at least for single tone excitations—has no difficulty covering a wide-bandwidth. The creation of a corresponding time domain model with a similar wide-bandwidth distortion characteristic would be more challenging. This is one of the motivations for keeping the measurement and modeling in the frequency domain (and hence, the use of 'spectral maps').

As described in step 304, FIGS. 8 and 9 also show the fits to low-order polynomials. The phase and amplitude dependence of the single-tone spur distortion should also be checked against any change in input amplitude, and this dependence may be added as an additional model parameter (if it is not predicted by simple scaling laws). FIGS. 8A, 8B, 9A and 9B are taken at the full amplitude input range $A_{max}$ and the data was checked for less than full amplitude with no significant discrepancies from a simple scaling prediction: namely, $(A_{in}/A_{max})^2$ for the second harmonic, and $(A_{in}/A_{max})^3$ for the third harmonic.

Figure 10:
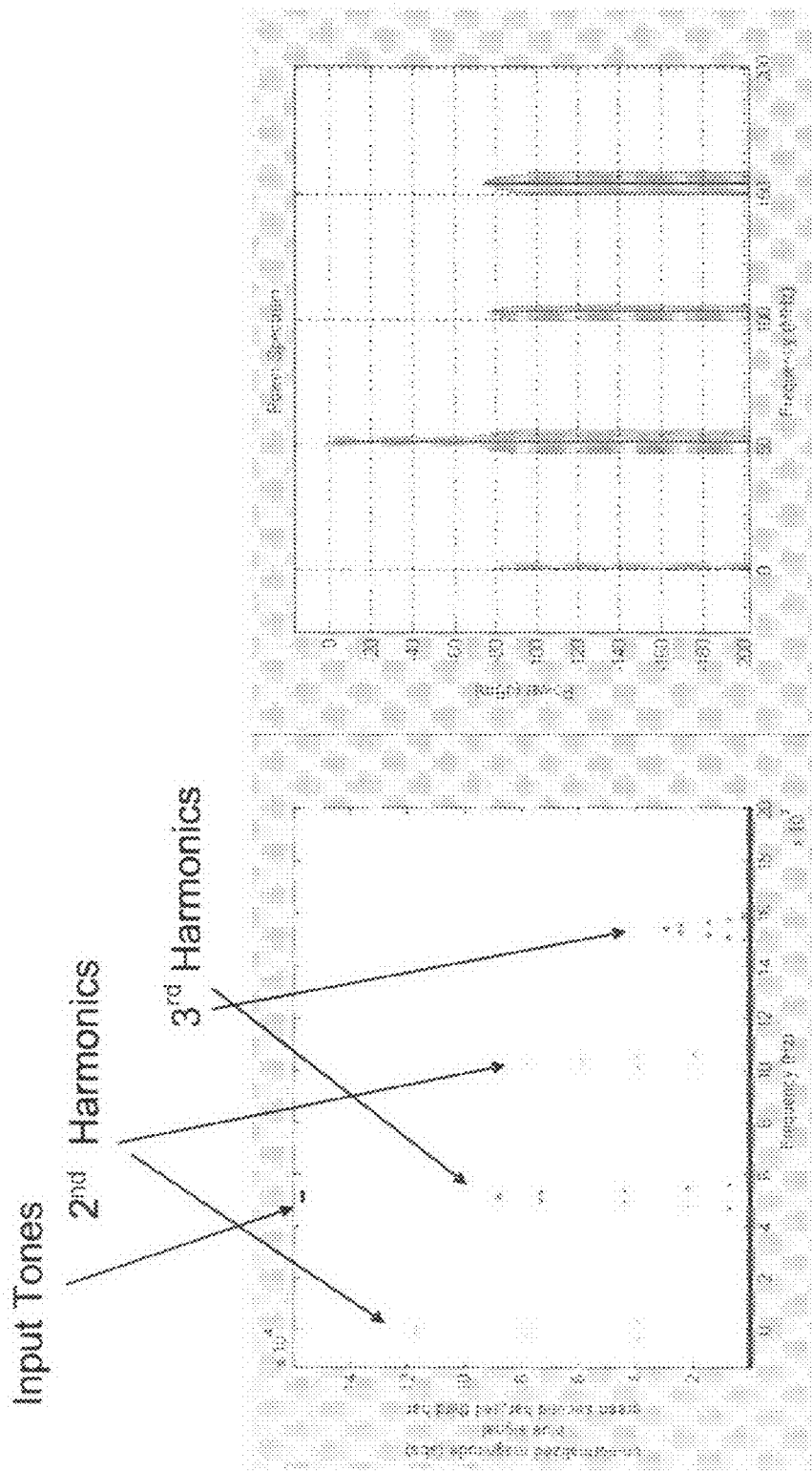
FIG. 10 illustrates an exemplary 'frequency set' for the apparatus shown in FIG. 5.
Figure 11A:
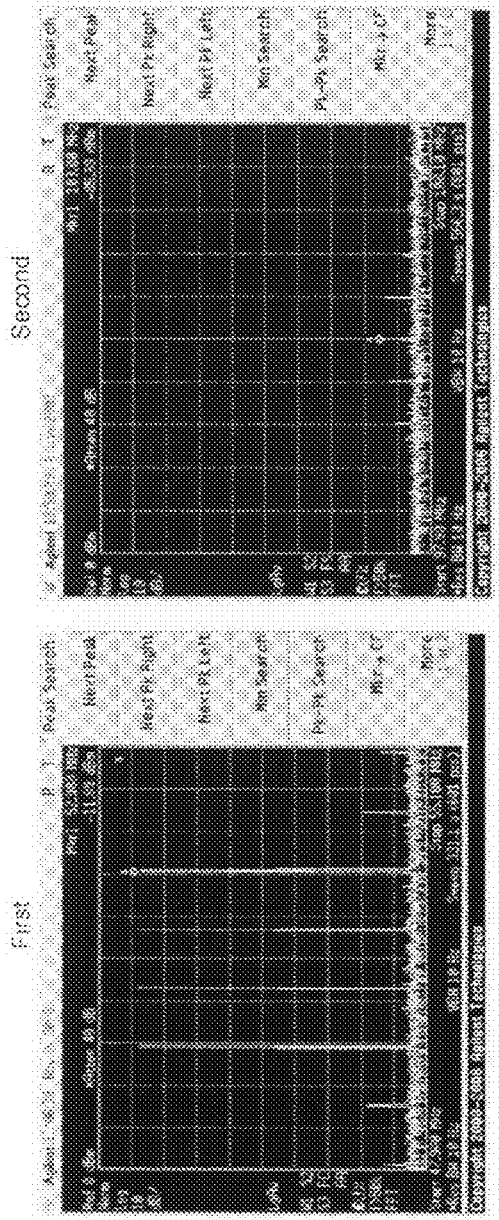
Figure 11A:
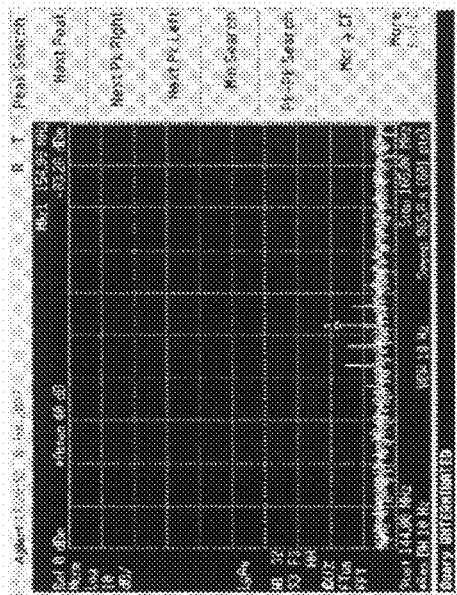
Figure 11B:
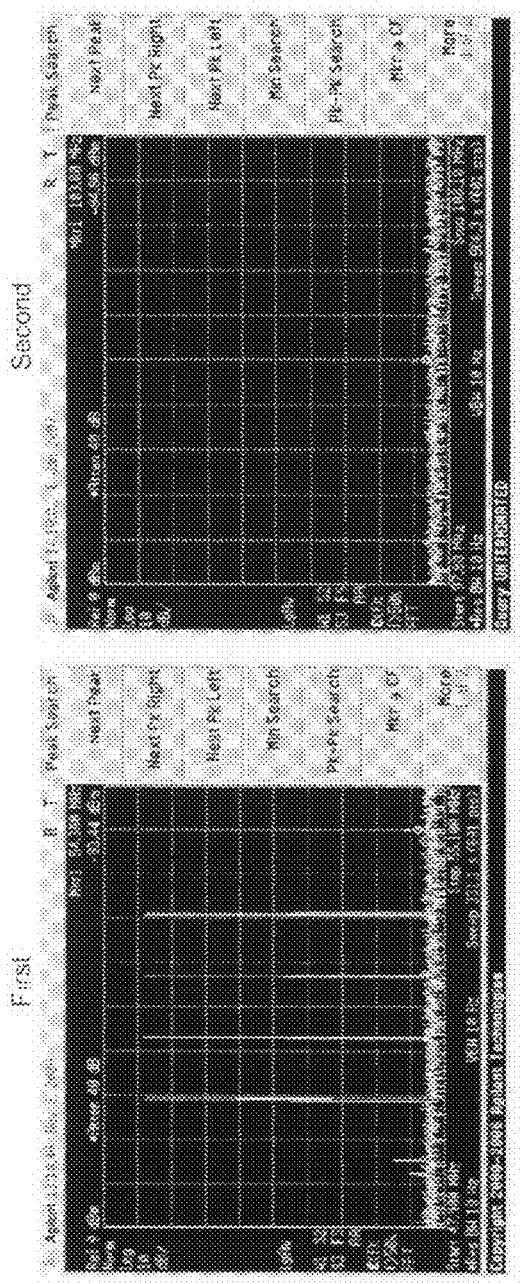
Figure 11B:
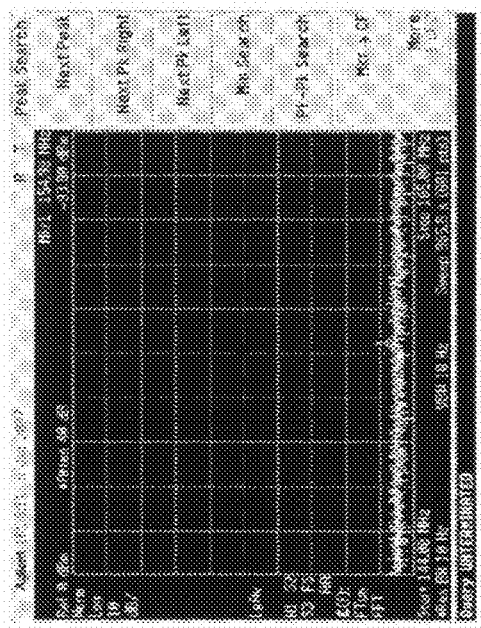
Figure 12A:
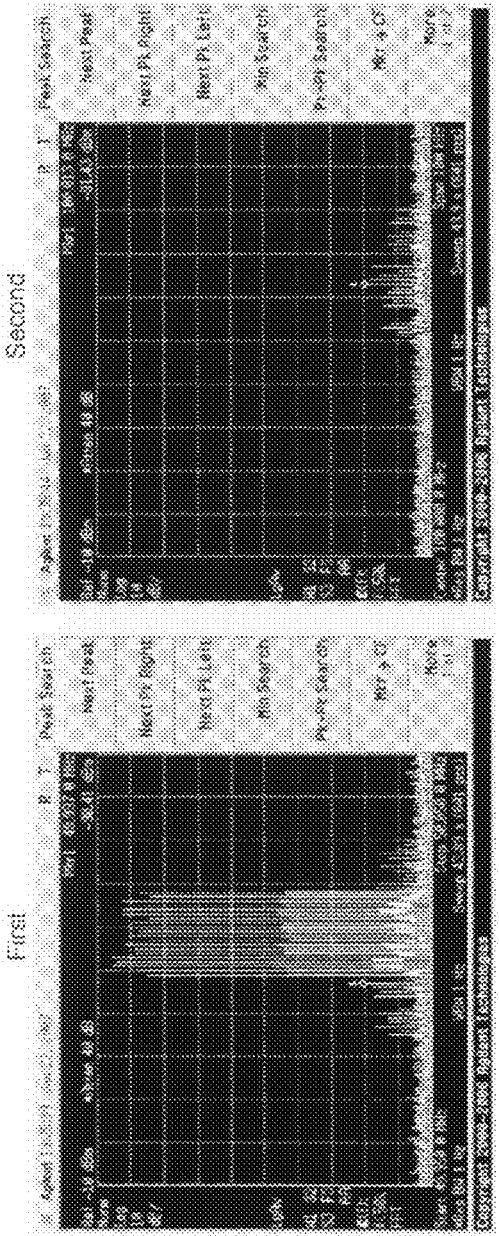
Figure 12A:
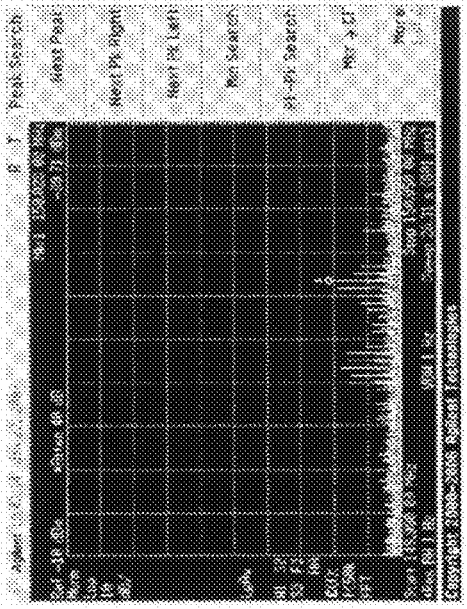
Figure 12B:
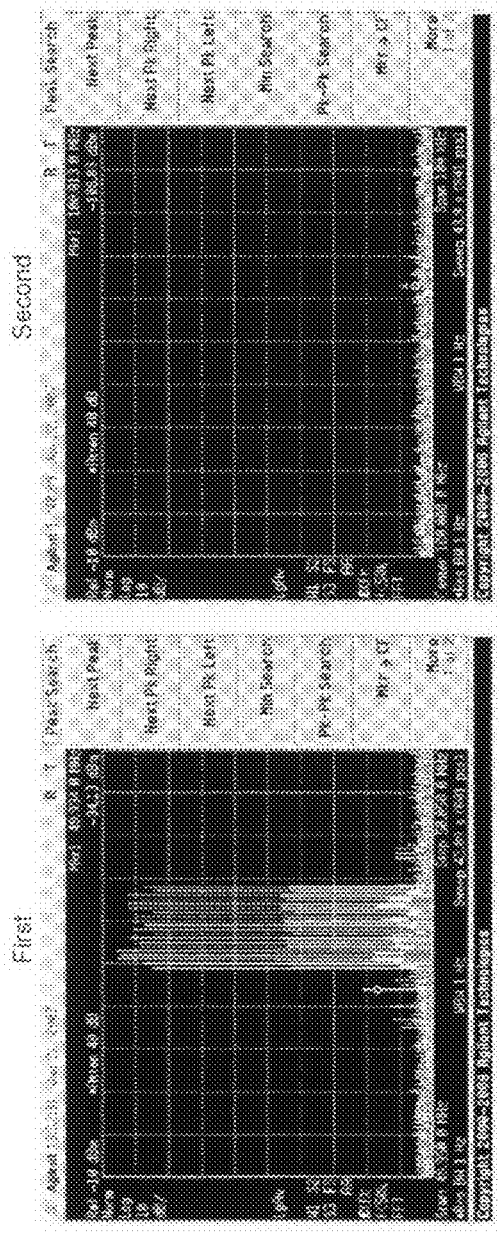
Figure 12B:
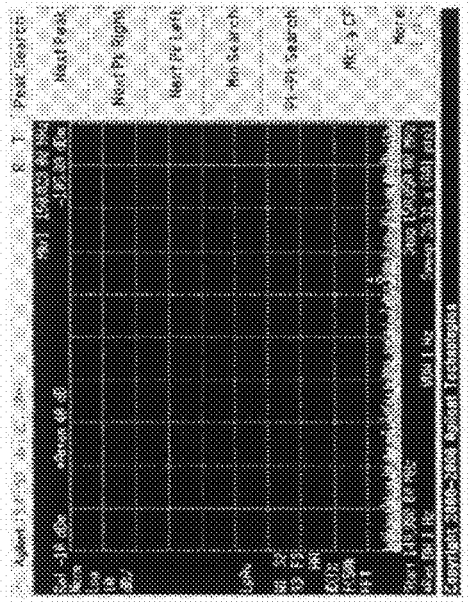

In step 306, U(k) may be computed analytically for a limited set of models (see Steer, supra) or by simulation. The simulation is straightforward. The function y(t) is computed in the time domain, the fast Fourier transform (FFT) of y(t) is taken, and the amplitudes and frequencies of any spurs above a predetermined amplitude level are recorded. The resulting set of phasors is called the 'frequency set', and all further computations are limited to computations or simulations on this restricted set of phasors, similar to what is done in harmonic balance methods of circuit simulators. See, e.g., Boris Troyanovsky, "Frequency Domain Algorithms for Simulating Large Signal Distortion in Semiconductor Devices", Dissertation, Stanford University (1997). FIG. 10 shows the frequency set for the exemplary signal path shown in FIG. 5. The example shows the computation of the output signal based on a four-tone input signal centered around 50 Megahertz (MHz). Different input signals will generate different frequency sets.

The output of step 308 is also shown in FIG. 10, on the right. The output spectrum limited to the 'frequency set' is multiplied (in the frequency domain) by the complex number from the corresponding calibration curves shown in FIGS. 8 & 9. This simply amounts to a rescaling and rotation of the phasors in the frequency set. The ad hoc assumption being made here is that, to 'first-order,' the output from a single tone test will be close to the output from a multitone test, where the input is not a single tone, but rather the phasor at U(k) whose amplitude and phase are computed as a weighted sum of the input tones. Put more simply, energy within the bin $k_m$ is getting mapped to bin $k_n$, at least to first-order, in the same way that a single tone gets mapped.

Figure 13:
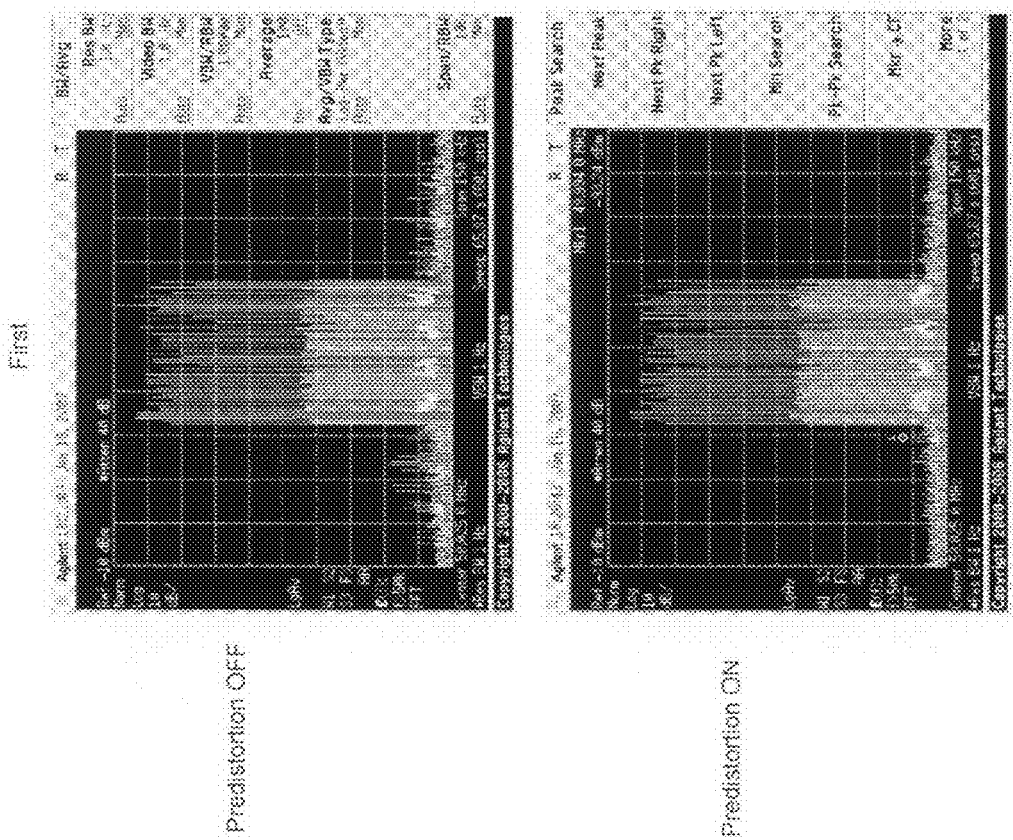
FIGS. 13A, 13B, 14A, 14B, 14C and 14D show close-ups of the output of the FIG. 5 signal path, with and without predistortion, for an exemplary complex input signal.
Figure 14:
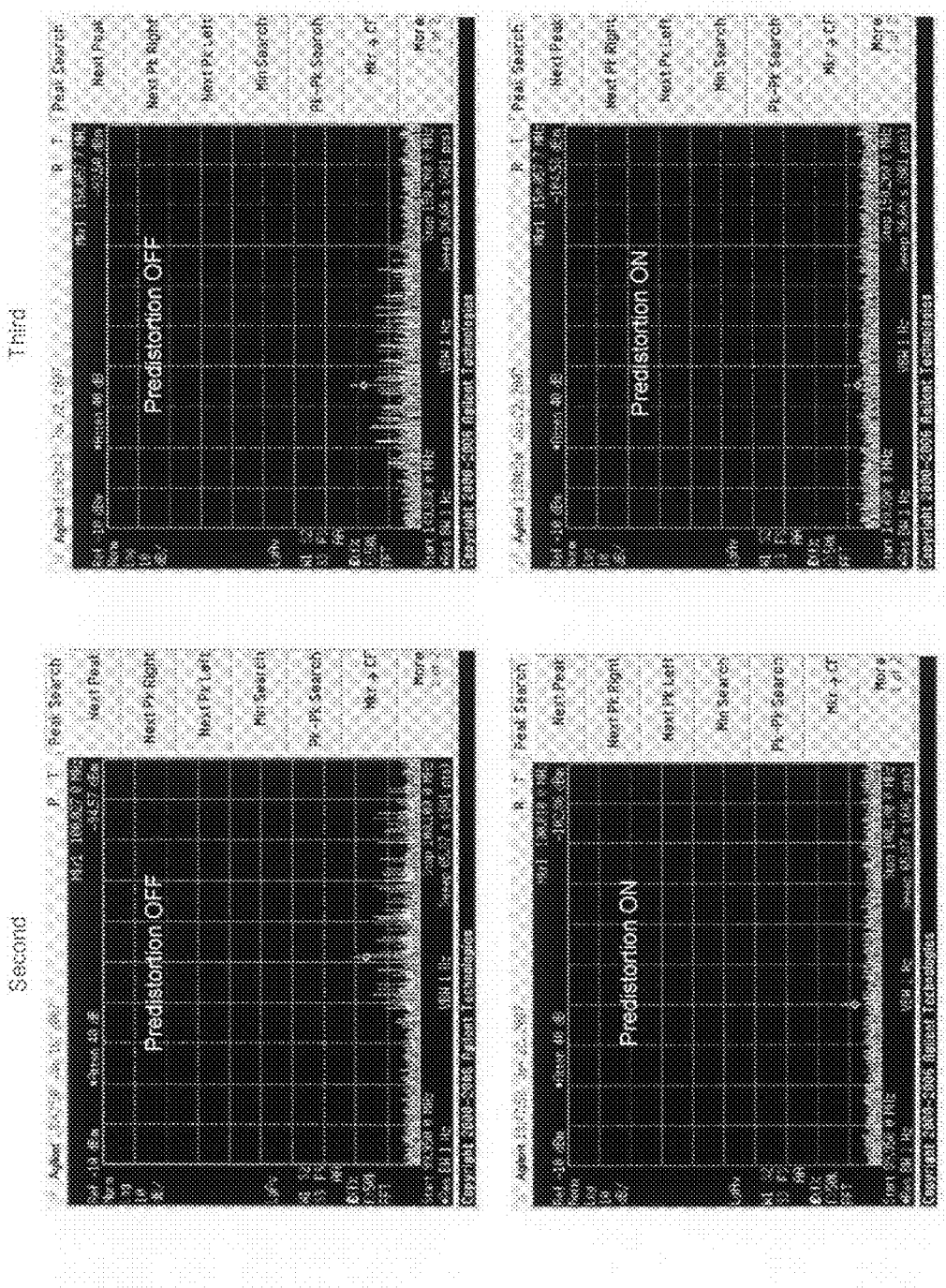

Step 310 of the method 300 examines the accuracy of the first-order model. See, FIG. 3. That is, the predicted spurs (both their phase and magnitude) are computed based on the input signal (in the frequency domain), and then a π radians out of phase version of this signal is added to the input of the arbitrary waveform generator. This correction, even for a few input tones, consists of many terms. FIGS. 11A, 11B, 11C, 11D, 11E, 11F, 12A 12B, 12C, 12D, 12E and 12F show results for the signal path shown in FIG. 5, for both multi-tone (FIGS. 11A, 11B, 11C, 11D, 11E & 11F) and pseudo-random (FIGS. 12A, 12B, 12C, 12D, 12E & 12F) signals, respectively. In both cases, the methods 200 and 300 show good performance for removing 'out-of-band' distortion. The test signal for FIGS. 13A and 13B is a pseudo-random test sequence which is passed through a very steep (100 dBc) band pass filter. FIGS. 13A, 13B, 14A, 14B, 14C and 14D show close-ups of the output of the FIG. 5 signal path, with and without predistortion, for an exemplary complex input signal.

Figure 15:
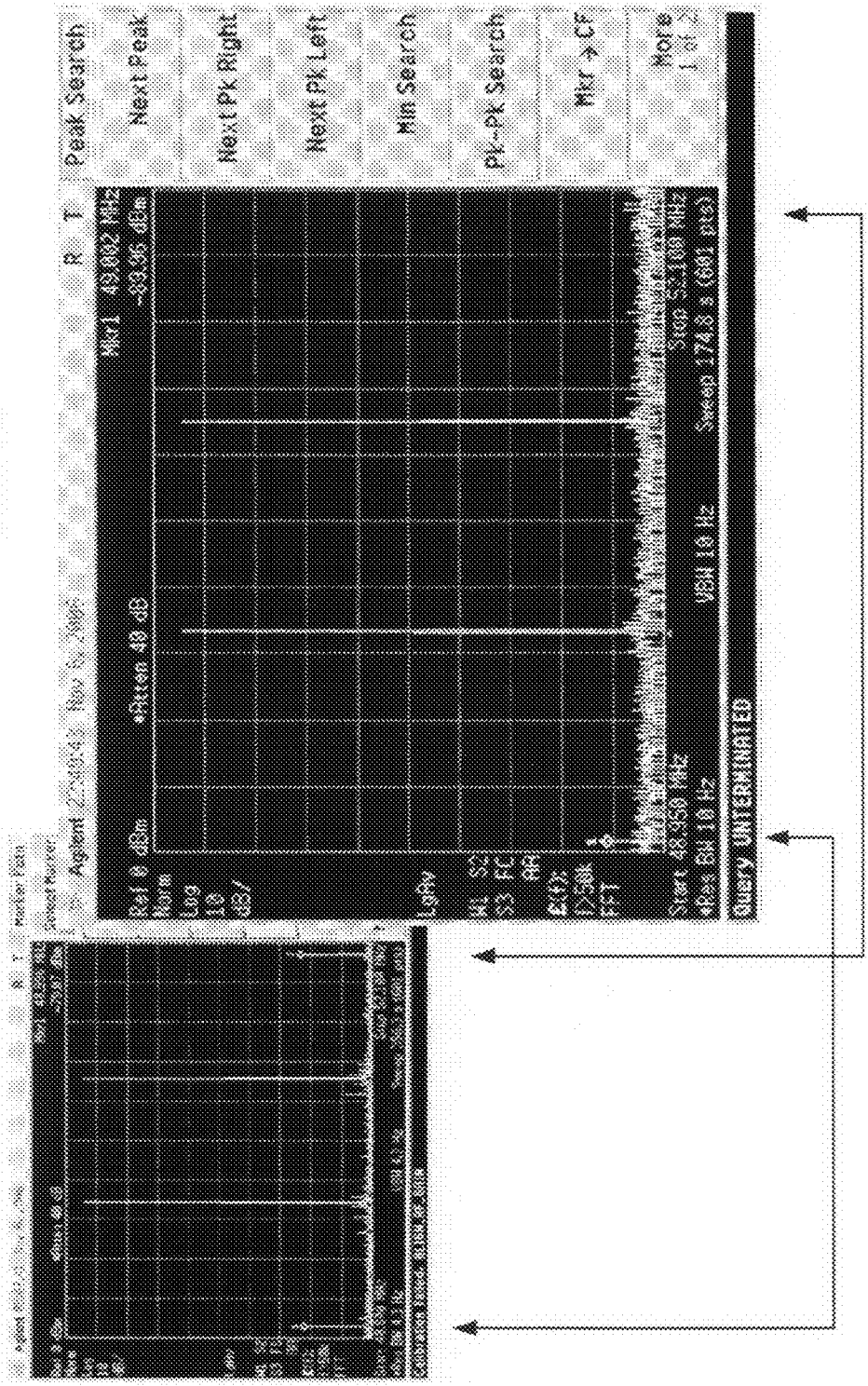
FIGS. 15A and 15B illustrate an exemplary reduction of intermodulation distortion using the methods illustrated in FIGS. 2 & 3.

Though a typical reduction of 4 dBm is seen for intermodulation terms, there also appears to be significant residual spurs at (or near to) the frequency band of the input (stimulus) signal. Steps 312-322 address this by constructing a two-tone calibration curve. In the example studied this is constructed at 1 Mhz steps, with a fixed offset tone of 1 Mhz. Variable offset models may also need to be considered, which increase model complexity. With the addition of this second order correction, or 'second-order model,' applied to the residual spur spectrum, a further reduction in intermodulation distortion can be archived as illustrated in FIGS. 15A and 15B.

The novel methods 200, 300, 400 and apparatus 116 disclosed herein can provide various advantages. First, they work with a complete electronic instrument or device and can therefore be applied to systems after their design and manufacturing is complete. That is, calibration can be applied after other system and design optimizations are complete.

Second, the methods and apparatus are based only on measured signal properties, and not on the detailed knowledge of electronic instruments or devices that is required by many calibration techniques. This means that the methods and apparatus can be applied to individual instruments or devices, or to systems composed of two or more connected instruments or devices. Also, the methods and apparatus can be used to calibrate 'distributed' electronic instruments and devices.

Third, the novel method and apparatus disclosed herein are iterative, and are based on a fixed sequence of relatively standard measurements, which unlike estimation of Volterra kernels, can be accomplished with fewer measurements. This is because the methods and apparatus described herein make use of measurement data in the initial creation of a model. The model is then whittled down to focus it on the nonlinear spurs that are actually measured at the start of the process. This is in contrast to methods based on a straight-forward implementation of Volterra theory, which need to estimate all Kernel elements, without using prior knowledge obtained by experiments to constrain the Volterra model. Placing early constraints on the modeling process, at least for calibration, enables an efficient number of measurements to be made. This tradeoff between model generality is well worth the simplification that results in fewer and simpler measurements then needed for the full identification of Volterra Kernels of a fixed order.

It is also noted that the methods and apparatus described herein differ fundamentally from the method proposed by Boyd, supra. Boyd's method only applies to systems where the second order Volterra kernel, $H_2(s_1,s_2)$, is non-zero for both $s_1$ and $s_2$—that is, data from a two-tone test is required, and there is no description of the use of data from a one-tone test model. In contrast, the methods and apparatus described above explicitly measure and use data from a one-tone test as the primary data for the first-order frequency response model. And, as previously mentioned, any Volterra series method only applies in cases where specific mathematical assumptions hold, namely the system is weakly linear, has 'fading memory,' and additional mathematical assumptions described by Boyd, supra. These characteristics are not required in the methods and apparatus described above.

What is claimed is:

1. A method of developing a spectral map for performing nonlinear calibration of a signal path, comprising:
   identifying a set of frequency locations for a set of particular output signal spurs that result from applying one-tone and two-tone input signals covering a bandwidth of interest to the signal path;
   developing, based on the set of frequency locations, a spectral map for predistorting, in the frequency domain, signals that are applied to, or received from, the signal path in the time domain; and
   saving the spectral map for performing nonlinear calibration of the signal path.

2. The method of claim 1, wherein the set of frequency locations for the set of particular output signal spurs is identified by performing a power spectral scan over the bandwidth of interest.

3. The method of claim 1, wherein the set of frequency locations for the set of particular output signal spurs is identified using at least one of: an analytic formula, and a simulation.

4. The method of claim 1, wherein developing the spectral map comprises:
   applying one-tone input signals covering the bandwidth of interest to the signal path, and measuring amplitudes and phases of single-tone spurs in the set of particular output signal spurs;
   using the measured amplitudes and phases of the single-tone spurs to construct a first-order frequency response model for the signal path;
   computing a first-order input amplitude spectrum in the frequency domain, restricted to the identified set of frequency locations; and
   developing, from the first-order frequency response model and the first-order input amplitude spectrum, a first-order spectral map for predistorting, in the frequency domain, signals that are applied to, or received from, the signal path in the time domain;
   wherein saving the spectral map comprises saving the first-order spectral map.

5. The method of claim 4, further comprising:
verifying performance of the first-order spectral map for various predistorted signals applied to, or received from, the signal path;
when the performance of the first-order spectral map is determined to provide insufficient mitigation of output signal spurs at the set of frequency locations, identifying a set of residual output signal spurs and,
applying two-tone input signals covering the bandwidth of interest to the signal path, and measuring amplitudes and phases of the residual output signal spurs;
using the measured amplitudes and phases of the residual output signal spurs to construct a second-order frequency response model for the signal path;
computing a second-order input amplitude spectrum in the frequency domain, restricted to the identified set of frequency locations; and
developing, from the second-order frequency response model and the second-order input amplitude spectrum, a second-order spectral map for predistorting, in the frequency domain, signals that are input to the signal path in the time domain;
wherein saving the spectral map comprises saving the second-order spectral map.

6. The method of claim 5, further comprising:
verifying a combined performance of the first-order spectral map and the second-order spectral map for various predistorted signals applied to, or received from, the signal path;
when the combined performance of the first-order spectral map and the second-order spectral map is determined to provide insufficient mitigation of output signal spurs at the set of frequency locations, i) identifying an additional set of residual output signal spurs, and ii) iteratively repeating the applying, using or computing steps to update the first-order spectral map or the second-order spectral map.

7. The method of claim 4, wherein the first-order frequency response model for the signal path is constructed by fitting low-order polynomials to the measured amplitudes and phases of the single-tone spurs.

8. The method of claim 4, further comprising, adding an input amplitude scaling parameter to the first-order frequency model.

9. The method of claim 4, further comprising:
varying the input amplitudes of the one-tone input signals applied to, or received from, the signal path, and measuring an input amplitude dependence of the measured amplitudes and phases of the single-tone spurs in the set of particular output signal spurs.

10. A method of performing nonlinear calibration of a signal path, comprising:
computing a discrete Fourier transform (DFT) of an input signal to the signal path;
applying a spectral map to the DFT of the input signal, to generate a predistorted signal in the frequency domain, the spectral map being based on i) a set of frequency locations for a set of particular output signal spurs that result from applying one-tone and two-tone input signals covering a bandwidth of interest to the signal path, and ii) measured amplitudes and phases of single-tone spurs resulting from an application of one-tone input signals to the signal path;
computing an inverse DFT (IDFT) of the predistorted signal in the frequency domain, to generate a predistorted signal in the time domain; and
causing an arbitrary waveform generator of the signal path to launch the predistorted signal in the time domain via the signal path.

11. The method of claim 10, wherein the input signal is a periodic waveform.

12. The method of claim 10, wherein the input signal is a multiperiodic waveform.

13. The method of claim 10, wherein the input signal is an arbitrary waveform.

14. The method of claim 10, wherein the signal path further comprises one of: an amplifier, and an up-converter.

15. The method of claim 10, wherein the spectral map is further based on measured amplitudes and phases of multiple-tone spurs resulting from an application of two-tone input signals to the signal path.

16. Apparatus for calibrating a signal path, comprising:
an arbitrary waveform generator, coupled in an input-end of the signal path; and
a distortion correction engine configured to,
receive an input signal for the arbitrary waveform generator;
compute a discrete Fourier transform (DFT) of the input signal;
apply a spectral map to the DFT of the input signal, to generate a predistorted signal in the frequency domain, the spectral map being based on i) a set of frequency locations for a set of particular output signal spurs that result from applying one-tone and two-tone input signals covering a bandwidth of interest to the signal path, and ii) measured amplitudes and phases of single-tone spurs resulting from an application of one-tone input signals to the signal path;
compute an inverse DFT (IDFT) of the predistorted signal in the frequency domain, to generate a predistorted signal in the time domain; and
provide the predistorted signal in the time domain to the arbitrary waveform generator.

17. The apparatus of claim 16, wherein the input signal is a periodic waveform.

18. The apparatus of claim 16, wherein the input signal is a multiperiodic waveform.

19. The apparatus of claim 16, wherein the input signal is an arbitrary waveform.

20. The apparatus of claim 16, wherein the signal path further comprises one of: an amplifier, and an up-converter.

* * * * *